(12) United States Patent
Herner (10) Patent No.: US 7,808,810 B2
(45) Date of Patent: Oct. 5, 2010

(54) MULTILEVEL NONVOLATILE MEMORY CELL COMPRISING A RESISTIVITY-SWITCHING OXIDE OR NITRIDE AND AN ANTIFUSE

(75) Inventor: S. Brad Herner, San Jose, CA (US)

(73) Assignee: Sandisk 3D LLC, Milpitas, CA (US)

( * ) Notice: Subject to any disclaimer, the term of this patent is extended or adjusted under 35 U.S.C. 154(b) by 430 days.

(21) Appl. No.: 11/394,903

(22) Filed: Mar. 31, 2006

(65) Prior Publication Data

US 2007/0236981 A1    Oct. 11, 2007

(51) Int. Cl.
*G11C 11/00* (2006.01)
*G11C 17/00* (2006.01)
*G11C 17/14* (2006.01)

(52) U.S. Cl. .................... 365/148; 365/225.7; 365/100; 365/96

(58) Field of Classification Search ................. 365/100, 365/148, 159, 225.7, 71, 96
See application file for complete search history.

(56) References Cited

U.S. PATENT DOCUMENTS

| | | | |
|---|---|---|---|
| 2,655,609 | A | 10/1953 | Shockley |
| 2,971,140 | A | 2/1961 | Chappey et al. |
| 3,796,926 | A * | 3/1974 | Cole et al. .................... 257/4 |
| 4,204,028 | A | 5/1980 | Donley |
| 4,499,557 | A | 2/1985 | Holmberg et al. |
| 4,646,266 | A | 2/1987 | Ovshinsky et al. |
| 4,772,571 | A | 9/1988 | Scovell et al. |
| 4,907,054 | A | 3/1990 | Berger |
| 4,940,553 | A | 7/1990 | von Benda |
| 5,037,200 | A | 8/1991 | Kodama |
| 5,166,758 | A | 11/1992 | Ovshinsky et al. |
| 5,273,915 | A | 12/1993 | Hwang et al. |
| 5,311,055 | A | 5/1994 | Goodman et al. |
| 5,774,394 | A | 6/1998 | Chen et al. |
| 5,854,102 | A | 12/1998 | Gonzalez et al. |
| 5,876,788 | A | 3/1999 | Bronner et al. |

(Continued)

FOREIGN PATENT DOCUMENTS

EP     1 308 960 A2    5/2003

(Continued)

OTHER PUBLICATIONS

Hiatt et al., "Bistable Switching in Niobium Oxide Diodes", Mar. 15, 1965, Applied Physics Letters, AIP, American Institute Of Physics, Melville, NY, US, vol. 6, No. 6, pp. 106-108.

(Continued)

*Primary Examiner*—J. H. Hur
(74) *Attorney, Agent, or Firm*—Dugan & Dugan, PC (57) ABSTRACT

A nonvolatile memory cell includes a layer of a resistivity-switching metal oxide or nitride compound, the metal oxide or nitride compound including one metal, and a dielectric rupture antifuse formed in series. The dielectric rupture antifuse may be either in its initial, non-conductive state or a ruptured, conductive state. The resistivity-switching metal oxide or nitride layer can be in a higher- or lower-resistivity state. By using both the state of the resistivity-switching layer and the antifuse to store data, more than two bits can be stored per memory cell.

7 Claims, 3 Drawing Sheets

U.S. PATENT DOCUMENTS

| | | | |
|---|---|---|---|
| 5,915,167 | A | 6/1999 | Leedy |
| 6,034,882 | A | 3/2000 | Johnson et al. |
| RE37,259 | E | 7/2001 | Ovshinsky |
| 6,369,431 | B1 | 4/2002 | Gonzalez et al. |
| 6,420,215 | B1 | 7/2002 | Knall et al. |
| 6,426,891 | B1 | 7/2002 | Katori |
| 6,465,370 | B1 | 10/2002 | Schrems |
| 6,483,734 | B1* | 11/2002 | Sharma et al. ............... 365/97 |
| 6,534,841 | B1 | 3/2003 | Van Brocklin et al. |
| 6,541,792 | B1 | 4/2003 | Tran et al. |
| 6,707,698 | B2 | 3/2004 | Fricke et al. |
| 6,753,561 | B1 | 6/2004 | Rinerson et al. |
| 6,761,985 | B2 | 7/2004 | Windisch et al. |
| 6,774,458 | B2 | 8/2004 | Fricke et al. |
| 6,778,441 | B2 | 8/2004 | Forbes et al. |
| 6,787,401 | B2 | 9/2004 | Gonzalez et al. |
| 6,798,685 | B2 | 9/2004 | Rinerson et al. |
| 6,815,744 | B1* | 11/2004 | Beck et al. ............... 257/295 |
| 6,831,854 | B2 | 12/2004 | Rinerson et al. |
| 6,834,008 | B2 | 12/2004 | Rinerson et al. |
| 6,836,421 | B2 | 12/2004 | Rinerson et al. |
| 6,850,429 | B2 | 2/2005 | Rinerson et al. |
| 6,850,455 | B2 | 2/2005 | Rinerson et al. |
| 6,856,536 | B2 | 2/2005 | Rinerson et al. |
| 6,859,382 | B2 | 2/2005 | Rinerson et al. |
| 6,870,755 | B2 | 3/2005 | Rinerson et al. |
| 6,946,719 | B2 | 9/2005 | Petti et al. |
| 6,952,030 | B2 | 10/2005 | Herner et al. |
| 7,116,573 | B2 | 10/2006 | Sakamoto et al. |
| 7,172,840 | B2 | 2/2007 | Chen et al. |
| 7,176,064 | B2 | 2/2007 | Herner et al. |
| 7,215,564 | B2 | 5/2007 | Happ et al. |
| 7,224,013 | B2 | 5/2007 | Herner et al. |
| 7,238,607 | B2 | 7/2007 | Dunton et al. |
| 7,265,049 | B2 | 9/2007 | Herner et al. |
| 7,285,464 | B2 | 10/2007 | Herner |
| 7,307,013 | B2 | 12/2007 | Raghuram et al. |
| 7,307,268 | B2 | 12/2007 | Scheuerlein |
| 7,391,064 | B1 | 6/2008 | Tripsas et al. |
| 7,501,331 | B2 | 3/2009 | Herner |
| 2002/0057594 | A1 | 5/2002 | Hirai |
| 2003/0013007 | A1 | 1/2003 | Kaun |
| 2003/0047727 | A1 | 3/2003 | Chiang |
| 2003/0081446 | A1 | 5/2003 | Fricke et al. |
| 2003/0209971 | A1 | 11/2003 | Kozicki |
| 2004/0002186 | A1 | 1/2004 | Vyvoda et al. |
| 2004/0084743 | A1 | 5/2004 | Vanbuskirk et al. |
| 2004/0095300 | A1 | 5/2004 | So et al. |
| 2004/0159828 | A1 | 8/2004 | Rinerson et al. |
| 2004/0159867 | A1 | 8/2004 | Kinney et al. |
| 2004/0159869 | A1 | 8/2004 | Rinerson et al. |
| 2004/0160798 | A1 | 8/2004 | Rinerson et al. |
| 2004/0160804 | A1 | 8/2004 | Rinerson et al. |
| 2004/0160805 | A1 | 8/2004 | Rinerson et al. |
| 2004/0160806 | A1 | 8/2004 | Rinerson et al. |
| 2004/0160807 | A1 | 8/2004 | Rinerson et al. |
| 2004/0160808 | A1 | 8/2004 | Rinerson et al. |
| 2004/0160812 | A1 | 8/2004 | Rinerson et al. |
| 2004/0160817 | A1 | 8/2004 | Rinerson et al. |
| 2004/0160818 | A1 | 8/2004 | Rinerson et al. |
| 2004/0160819 | A1 | 8/2004 | Rinerson et al. |
| 2004/0161888 | A1 | 8/2004 | Rinerson et al. |
| 2004/0170040 | A1 | 9/2004 | Rinerson et al. |
| 2004/0228172 | A1 | 11/2004 | Rinerson et al. |
| 2004/0245557 | A1 | 12/2004 | Seo et al. |
| 2005/0045919 | A1 | 3/2005 | Kaeriyama et al. |
| 2005/0052915 | A1 | 3/2005 | Herner |
| 2005/0058009 | A1 | 3/2005 | Yang |
| 2005/0167699 | A1 | 8/2005 | Sugita |
| 2005/0221200 | A1 | 10/2005 | Chen et al. |
| 2005/0226067 | A1 | 10/2005 | Herner |
| 2005/0247921 | A1 | 11/2005 | Lee et al. |
| 2005/0286211 | A1 | 12/2005 | Pinnow et al. |
| 2006/0006495 | A1 | 1/2006 | Herner et al. |
| 2006/0067117 | A1 | 3/2006 | Petti |
| 2006/0094236 | A1 | 5/2006 | Elkins |
| 2006/0098472 | A1 | 5/2006 | Ahn et al. |
| 2006/0128153 | A1 | 6/2006 | Dunton et al. |
| 2006/0157679 | A1 | 7/2006 | Scheuerlein |
| 2006/0164880 | A1 | 7/2006 | Sakamoto et al. |
| 2006/0250836 | A1 | 11/2006 | Herner et al. |
| 2006/0250837 | A1 | 11/2006 | Herner et al. |
| 2006/0268594 | A1 | 11/2006 | Toda |
| 2006/0273298 | A1 | 12/2006 | Petti |
| 2007/0010100 | A1 | 1/2007 | Raghuram et al. |
| 2007/0072360 | A1 | 3/2007 | Kumar et al. |
| 2007/0114508 | A1 | 5/2007 | Herner et al. |
| 2007/0114509 | A1 | 5/2007 | Herner |
| 2007/0228354 | A1 | 10/2007 | Scheuerlein |
| 2007/0228414 | A1 | 10/2007 | Kumar et al. |
| 2007/0246743 | A1 | 10/2007 | Cho et al. |
| 2008/0175032 | A1 | 7/2008 | Tanaka et al. |
| 2009/0001342 | A1 | 1/2009 | Schricker et al. |
| 2009/0001343 | A1 | 1/2009 | Schricker et al. |
| 2009/0001344 | A1 | 1/2009 | Schricker et al. |
| 2009/0001345 | A1 | 1/2009 | Schricker et al. |
| 2009/0104756 | A1 | 4/2009 | Kumar |
| 2009/0236581 | A1 | 9/2009 | Yoshida et al. |

FOREIGN PATENT DOCUMENTS

| | | |
|---|---|---|
| EP | 1 484 799 A2 | 12/2004 |
| EP | 1 513 159 A2 | 3/2005 |
| EP | 1 914 806 A1 | 4/2008 |
| GB | 1 284 645 | 8/1972 |
| GB | 1 416 644 | 12/1975 |
| GB | 1416644 | 12/1975 |
| JP | 62042582 | 2/1987 |
| WO | WO 97/41606 | 11/1997 |
| WO | WO 00/49659 A1 | 8/2000 |
| WO | WO 01/69655 A2 | 9/2001 |
| WO | WO 03/079463 A2 | 9/2003 |
| WO | WO 2005/024839 A1 | 3/2005 |
| WO | WO 2006/078505 A2 | 7/2006 |
| WO | WO 2006/121837 A2 | 11/2006 |
| WO | WO 2006/121837 A3 | 11/2006 |
| WO | WO 2007/004843 A1 | 1/2007 |
| WO | WO 2007/038709 | 4/2007 |
| WO | WO 2007/062022 A1 | 5/2007 |
| WO | WO 2007/067448 A1 | 6/2007 |
| WO | WO 2007/072308 A1 | 6/2007 |
| WO | WO 2008/097742 | 8/2008 |

OTHER PUBLICATIONS

Hwang et al., "Molecular Dynamics Simulations Of Nanomemory Element Based on Boron-Nitride Nanotube-To-Peapod Transition", Apr. 2005, Computational Materials Science, Elsevier, Amsterdam, NL, vol. 33, No. 1-3, pp. 317-324.

Prince, B, "Trends in Scaled and Nanotechnology Memories", Sep. 2005, Non-Volatile Memory Technology Symposium, IEEE, Piscataway, NJ, USA, pp. 55-61.

Baek et al., "Multi-layer Cross-point Binary Oxide Resistive Memory (OxRRAM) for Post-NAND Storage Application," 2005, pp. 1-4, IEEE.

Baek, I.G.,et al.,Highly Scalable Non-volatile Resistive Memory Using Simple Binary Oxide Driven by Asymmetric Unipolar Voltage Pulses-, IEDM (2004), (Jan. 2004), 587-590.

Beck, et al., "Reproducible Switching Effect in Thin Oxide Films for Memory Applications," Applied Physics Letters, vol. 77, No. 1, Jul. 3, 2000, pp. 139-141, XP00958527, ISSN: 0003-6951.

Bruyere et al., "Switching and Negative Resistance in Thin Films of Nickel Oxide", Applied Physics Letters, vol. 16, No. 1, Jan. 1, 1970, pp. 40-43.

Mine, Lili, "ReRAM with Erase/Read Speed of 3ns, Applicable as Multi-Level cell", Dec. 26, 2006. Nikkei Electronics, <http://techon.nikkeibp.co.jp/english/NEWS_EN/20061226/12591&f>; pp. 1-2.

Pagnia, H., et al., "Bistable switching in Electroformed Metal-Insulator-Metal Devices", Phvs. Stat. Sol. A 108 11, (1988), 10-65.

Park, Jae-Wan., et at. "Reproducible resistive switching in nonstoichiometric nickel oxide films grown by rf reactive sputtering for resistive random access memory applications", J. Vac. Sci. Technol. A 23(5). (Sep./Oct. 2005), 1309-1313.

Roginskaya et al., "Characterization of Bulk and Surface Composition of $Co_xNi_{1-x}O_y$ Mixed Oxides for Electrocatalyis", Langmuir, vol. 13, No. 17, 1997, pp. 4621-4627.

Scheuerlein et al., "A 10ns Read and Write Non-Volatile Memory Array Using a Magnetic Tunnel Junction and FET Switch in each Cell," 2000, IEEE International Solid-State Circuits Conference, pp. 1-2.

Seo, S., et al.,"Reproducible resistance switching in polycrystalline NiO films", . Appl. Phys. Lett. vol. 85 No. 23 (2004), (Dec. 6, 2004), 5655-5657.

Seo, S., et al. "Conductivity switching characteristics and reset currents in NiO films", Appl. Phvs. Lett. 86 093509 (2005), 093509;093509-2;093509-3.

Sim et al., "Resistance Switching Characteristics of Polycrystalline Nb2O5 for Nonvolatile Memory Application", IEEE Electron Device Letters vol. 26, Issue 3, pp. 292-294 (2005), published May 2, 2005.

Windisch, et al., "Synthesis and Characterization of Transparent Conducting Oxide Cobalt-Nickel Spinel Films", Journal of Vacuum Science & Technology A, vol. 19, No. 4, Jul. 2001 pp. 1647-1651.

Sep. 3, 2007 International Search Report and Written Opinion of International Application No. PCT/US2007/007109 (SD-MA-169-PCT)).

Sep. 10, 2008 International Preliminary Report on Patentability and Written Opinion of International Application No. PCT/US2007/007109 (SD-MA-169-PCT).

Malhi et al., "Characteristics and Three-Dimensional Integration of MOSFET's in Small-Grain LPCVD Polycrystalline Silicon", Feb. 1985, IEEE Journal of Solid-State Circuits, vol. sc-20, No. 1, pp. 178-201.

Choi et al., "Resistive Switching Mechanism of TiO2 Thin Films Grown by Atomic-Layer Deposition", 2005, Journal of Applied Physics 98, pp. 033715-1-033715-10.

Shih et al., "Study of Anodic Oxidation of Aluminum in Mixed Acid using a Pulsed Current", 2000, Surface and Coatings Technology 124, pp. 278-285.

F C Eze, "Electroless Deposition of CoO Thin Films", J. Phys. D: Appl. Phys. 32 (1999), pp. 533-540.

Milgram, "Selective Surfaces of Anodic Copper Oxide for Solar Collectors" Jun. 1983, J. Appl. Phys. 54 (6), pp. 3640-3642.

Lu et al., "Study of the Electroless Deposition Process of Ni-P-Based Ternary Alloys", 2003, Journal of The Electrochemical Society, 150 (11), pp. C777-C786.

Osaka et al., "Electroless Nickel Ternary Alloy Deposition on SiO2 for Application to Diffusion Barrier Layer in Copper Interconnect Technology", 2002, Journal of The Electrochemical Society, 149 (11), pp. C573-C578.

Han et al., "The Growth Mechanism of Nickel Oxide Thin Films by Room-Temperature Chemical Bath Deposition", 2006, Journal of The Electrochemical Society, 153 (6), pp. C382-C386.

G.P. Burns, "Titanium Dioxide Dielectric Films Formed by Rapid Thermal Oxidation", Mar. 1, 1989, J. Appl. Phys. 65 (5), pp. 2095-2097.

Fujimoto et al., "TiO2 Anatase Nanolayer on TiN Thin Film Exhibiting High-Speed Bipolar Resistive Switching", 2006, Applied Physics Letters 89, pp. 223509-1-223509-3.

Takano et al., "Mechanism of the Chemical Deposition of Nickel on Silicon Wafers in Aqueous Solution", 1999, Journal of The Electrochemical Society, 146 (4), pp. 1407-1411.

Abouatallah et al., "Characterization of Vanadium Deposit Formation at a Hydrogen Evolving Electrode in Alkaline Media", 2001, Journal of The Electrochemical Society, 148 (9), pp. E357-E363.

Christensen et al., "The Influence of Oxide on the Electrodeposition of Niobium from Alkali Fluoride Melts", May 1994, J. Electrochem. Soc., vol. 141, No. 5, pp. 1212-1220.

Lantelme et al., "Electrodeposition of Tantalum in NaCl-KCl-K2TzF7 Melts", May 1992, J. Electrochem. Soc., vol. 139, No. 5, pp. 1249-1255.

Herner et. al., "Vertical p-i-n Polysilicon Diode With Antifuse for Stackable Field-Programmable ROM", May 2004, IEEE Electron Device Letters, vol. 25, No. 5, pp. 271-273.

Fuschillo, et al., "Non-Linear Transport and Switching Properties of Transition Metal Oxides," 6th International Vacuum Congress, Kyoto Japan, Mar. 25-29, 1974, Japanese Journal of Applied Physics Suppl., vol. 2, No. 1, 1974, pp. 817-820, XP002429046, ISSN: 0021-4922.

Jeong et al., "Ultraviolet-enhanced photodiode employing n-ZnO/p-Si structure", Applied Physics Letters, American Institute of Physics, Melville, NY, US, vol. 83, No. 14, Oct. 6, 2003, pp. 2946-2948.

Ozgur et al., "A comprehensive review of ZnO materials and devices", Journal of Applied Physics, American Institute of Physics, New York, US, vol. 98, No. 4, Aug. 30, 2005, pp. 1-103.

Sim et al., "Excellent Resistance Switching Characteristics of Pt/SrTiO3 Schottky Junction for Multi-bit Nonvolatile Memory Application", Electron Devices Meeting, 2005, IEDM Technical Digest, IEEE International Dec. 5, 2005, Piscataway, NJ, USA, pp. 758-761.

Ansari, et al., "Pre- and Post-Threshold Conduction Mechanisms in Thermally Grown Titanium Oxide Films", J. Phys. D. Appl. Phys. 20, (1987), pp. 1063-1066.

Herner et al., U.S. Appl. No. 10/326,470, filed Dec. 19, 2002 (MA-086).

* cited by examiner

MULTILEVEL NONVOLATILE MEMORY CELL COMPRISING A RESISTIVITY-SWITCHING OXIDE OR NITRIDE AND AN ANTIFUSE

RELATED APPLICATION

This application is related to Scheuerlein, U.S. patent application Ser. No. 11/395,421, "Nonvolatile Rewriteable Memory Cell Comprising a Resistivity-Switching Oxide or Nitride and an Antifuse," hereinafter the '421 application; and to Herner et al., U.S. patent application Ser. No. 11/395,995, "Nonvolatile Memory Cell Comprising a Diode and a Resistance-Switching Material," hereinafter the '995 application, both assigned to the assignee of the present invention, filed on even date herewith and hereby incorporated by reference in their entireties.

BACKGROUND OF THE INVENTION

The invention relates to a nonvolatile memory cell comprising a resistivity-switching material.

A resistivity-switching material which can be reversibly switched between stable resistivity states can be used in a nonvolatile memory cell. The resistivity state of the resistivity-switching material serves to store data.

It is advantageous to increase density of a memory array by increasing the number of data states that can be stored in each cell in the array.

SUMMARY OF THE PREFERRED EMBODIMENTS

The present invention is defined by the following claims, and nothing in this section should be taken as a limitation on those claims. In general, the invention is directed to a nonvolatile memory cell comprising a resistivity-switching material.

A first aspect of the invention provides for a nonvolatile memory array comprising a first plurality of memory cells, each memory cell of the first plurality comprising: a dielectric rupture antifuse; a resistance-switching memory element comprising a layer of a resistivity-switching metal oxide or nitride compound, the metal oxide or nitride compound including only one metal, wherein the array comprises: a) a first memory cell storing a first data state, wherein the antifuse of the first cell is unruptured and the resistance-switching memory element of the first cell is in a high-resistivity state; b) a second memory cell storing a second data state, wherein the antifuse of the second cell is ruptured and the resistivity-switching memory element of the second cell is in a low-resistivity state; and c) a third memory cell storing a third data state, wherein the antifuse of the third memory cell is ruptured and the resistivity-switching memory element of the third cell is in a high-resistivity state.

Another aspect of the invention provides for a method for forming and programming a one-time programmable nonvolatile memory cell, the method comprising: forming a dielectric rupture antifuse; and forming a layer of a resistivity-switching metal oxide or nitride compound, the metal oxide or nitride compound including only one metal, wherein the dielectric rupture antifuse and the resistance-switching element are arranged electrically in series in the nonvolatile memory cell, wherein, after fabrication of the memory cell is complete, with no application of an electrical pulse, the memory cell stores a first data state.

A preferred embodiment of the invention provides for a monolithic three dimensional memory array comprising: i) a first memory level monolithically formed above a substrate, the first memory level comprising: a) a plurality of substantially parallel, substantially coplanar first conductors; b) a plurality of substantially parallel, substantially coplanar second conductors above the first conductors; and c) a first plurality of memory cells, each memory cell comprising a dielectric rupture antifuse, a portion of one of the bottom conductors, and a portion of one of the top conductors, a layer of a resistivity-switching metal oxide or nitride compound, wherein the metal oxide or nitride compound includes only one metal, and wherein the dielectric rupture antifuse and the layer of resistivity-switching metal oxide or nitride are arranged electrically in series between the portion of the top conductor and the portion of the bottom conductor, wherein each memory cell of the first plurality is a one-time programmable memory cell, and ii) a second memory level monolithically formed above the first memory level.

Another aspect of the invention provides for a nonvolatile memory cell comprising: a resistance-switching element comprising a layer of a resistivity-switching metal oxide or nitride compound, the metal oxide or nitride compound including only one metal; a dielectric rupture antifuse; and a diode, wherein the diode comprises silicon or an alloy of silicon, wherein the silicon or alloy of silicon of the diode is crystallized adjacent to a silicide.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

A nonvolatile memory cell including a resistivity-switching layer of a metal oxide or nitride compound, the metal oxide or nitride compound including one metal, has been disclosed in Herner et al., U.S. patent application Ser. No. 11/125,939, "Rewriteable Memory Cell Comprising a Diode and a Resistance-Switching Material," filed May 9, 2005, hereinafter the '939 application and hereby incorporated by reference; and in Herner et al., the '995 application filed on even date herewith. In preferred embodiments, the resistivity-switching layer is arranged in series with a diode. In both of these applications, a data state of the memory cell is stored in the resistivity state of the resistivity-switching layer; i.e., a memory cell having its resistivity-switching layer in a low-resistivity state may correspond to a data '0', while a memory cell having its resistivity-switching layer in a high-resistivity state may correspond to a data '1', or vice versa.

The resistivity-switching material is a layer of a metal oxide or nitride compound, the metal oxide or nitride compound including exactly one metal. Preferred metal oxide or nitride compounds include $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, where x and y range between 0 and 1. Examples are the stoichiometric compounds NiO, $Nb_2O_5$, $TiO_2$, $HfO_2$, $Al_2O_3$, $MgO_x$, CoO, $CrO_2$, VO, ZnO, ZrO, BN, and AlN, but nonstoichiometric compounds may be used as well. A layer of one of these materials is formed in an initial stable resistivity state, for example a high-resistivity state. That initial resistivity state can be changed to a different stable resistivity state by application of an appropriate electrical pulse. A pulse that changes the resistivity-switching layer from a higher-resistivity reset state to a lower-resistivity set state is a set pulse, while a pulse that changes the resistivity-switching layer from a lower-resistivity state to a higher-resistivity state is a reset pulse. Where appropriate, this description will also speak of a set voltage, set current, reset voltage, or reset current.

In the present invention, a dielectric rupture antifuse is included in series with the resistivity-switching layer. The dielectric rupture antifuse is formed in an initial non-conductive state, impeding current flow. Upon application of a programming pulse, the dielectric material of the antifuse suffers dielectric breakdown, altering the dielectric rupture antifuse permanently and causing it to become conductive, permitting higher current flow. In preferred embodiments, a diode is also formed in series with the dielectric rupture antifuse and the resistivity-switching layer.

The state of the dielectric rupture antifuse itself, intact or ruptured, serves to store memory data. For example, in one embodiment, if the resistivity-switching layer is high-resistivity and the antifuse is intact and non-conductive, the data state is '00', while if the resistivity-switching layer is low-resistivity and the antifuse is ruptured and conductive, the data state of the memory cell is '11'. A memory cell having an intact antifuse and a resistivity-switching layer in a low-resistivity state may store a '01' state, while a memory cell having a ruptured antifuse and a resistivity-switching layer in a high-resistivity state may store a '10' state.

Figure 1:
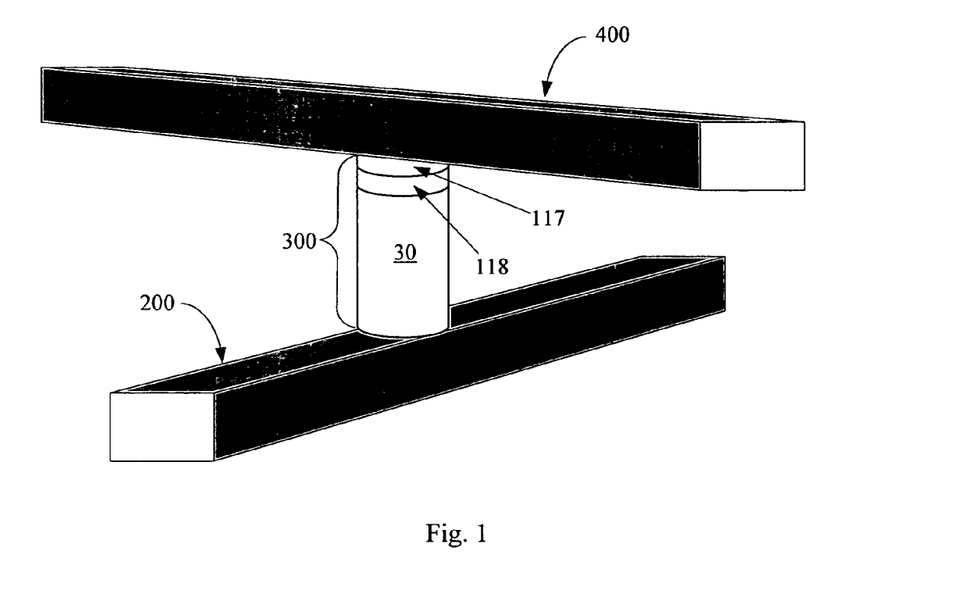
FIG. 1 is a perspective view of a nonvolatile memory cell formed according to a preferred embodiment of the present invention.

FIG. 1 shows a memory cell according to a preferred embodiment of the present invention. A pillar 300 includes a vertically oriented diode 30, a resistivity-switching layer 118, and a dielectric rupture antifuse 117, vertically disposed in series between a bottom conductor 200 and a top conductor 400. Most embodiments will include additional layers, serving as barrier layers, adhesion layers, etc., as will be described.

Figure 2:
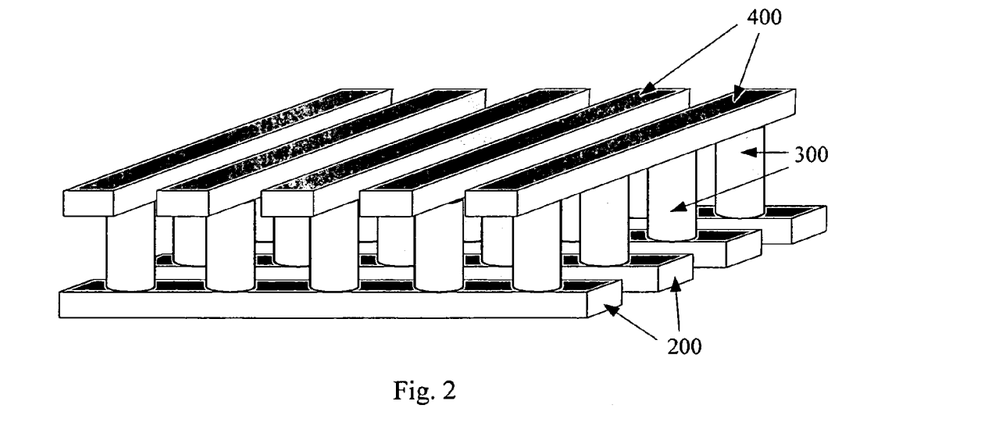
FIG. 2 is a perspective view of a portion of a memory level comprising a plurality of the memory cells of FIG. 1.

FIG. 2 shows a memory level of such memory cells, which can be formed by forming a plurality of substantially coplanar bottom conductors 200, pillars 300, and top conductors 400. This memory level can be formed of deposited layers above a substrate, for example a monocrystalline semiconductor substrate, a silicon-on-insulator substrate, or some other suitable substrate. Two, three, four or more such memory levels can be stacked to form a monolithic three dimensional memory array.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Monolithic three dimensional memory arrays are described in Johnson et al., U.S. Pat. No. 6,034,882, "Vertically stacked field programmable nonvolatile memory and method of fabrication"; in Knall et al., U.S. Pat. No. 6,420, 215, "Three Dimensional Memory Array and Method of Fabrication"; and in Herner et al., U.S. Pat. No. 6,952,030, "High-density three-dimensional memory cell," all hereby incorporated by reference.

In preferred embodiments, the memory cell becomes a two-bit cell, where the state of the antifuse corresponds to a first bit, and the state of the resistivity-switching material corresponds to a second bit. The cell may be used as a one-time programmable memory cell.

For simplicity, this discussion will assume nickel oxide is used as the resistivity-switching material. It will be understood that any of the other named materials can be used instead. It will further be understood that in this discussion "nickel oxide" refers to both stoichiometric and nonstoichiometric oxides of nickel.

Table 1 lists each of the four achievable data states, and for a preferred embodiment, lists the programming voltage(s) required to attain the state, and the current that will flow through the cell at an applied read voltage of +2 volts. These different read currents allow the different data states to be distinguished from one another. It will be understood that the voltages and currents provided in Table 1 are examples only and will vary depending on the resistivity-switching material selected, layer thickness, and many other details of cell construction.

TABLE 1

| Data State | Antifuse State | Switching Layer State | Programming | Read current at +2 V |
|---|---|---|---|---|
| 00 | Intact | Reset | No programming | $1 \times 10^{-10}$ amps |
| 01 | Intact | Set | +6 V | $1 \times 10^{-9}$ amps |
| 10 | Ruptured | Reset | +10 V, –9 V | $1 \times 10^{-8}$ amps |
| 11 | Ruptured | Set | +10 V | $1 \times 10^{-5}$ amps |

The initial state of the cell, after fabrication is complete, can be called the '00' state, in which the antifuse is intact and the switching region of the nickel oxide is in the high-resistivity state. This is a first data state. No programming step or electrical pulse across the memory cell is required to attain this first data state.

To reach the '11' state, in which the antifuse is ruptured and a switching region of the nickel oxide is placed in the low-resistivity or set state, a relatively large set voltage of, for example, +10 volts is applied to a memory cell in the initial, '00' state. Depending on the construction of the cell, the switching region may be the entire nickel oxide layer or only a portion of it.

To reach the '10' state, in which the antifuse is ruptured and a switching region of the nickel oxide is in the high-resistivity, reset state, a two-step process is required. First a relatively large positive set voltage, for example +10 volts, is applied to a memory cell in the initial '00' state, rupturing the antifuse and placing a switching region of the nickel oxide in the low-resistivity set state. Next a reset pulse is applied to the memory cell, resetting a switching region of the nickel oxide to the high-resistivity state. Generally a reset pulse has a lower voltage than a set pulse. Depending on the material and the cell configuration, a reset pulse may need to have a polarity opposite the set pulse; this has been observed for a nickel oxide layer in series with a diode. For example, the +10 volt set pulse may be followed by a −9 volt reset pulse.

To reach the '01' state, in which the antifuse is intact and a switching region of the nickel oxide is in the low-resistivity set state, a pulse must be applied to a cell in the initial '00' state which will set a switching region of the nickel oxide but not rupture the antifuse. For example, in some embodiments a pulse of +6 volts will set a switching region of the nickel oxide layer but will not rupture the antifuse.

In practice, the '01' state, in which the nickel oxide is placed in the set state without rupturing the antifuse, may be difficult to achieve. In some embodiments, then, this state may not be used. The cell will be a three-state cell, which affords an increase in density over a cell having only two states.

In other embodiments, the resistivity-switching layer may be formed in a low-resistivity state.

A nonvolatile memory array according to the present invention, then, will comprise memory cells, each memory cell comprising a dielectric rupture antifuse; and a resistance-switching memory element comprising a layer of a resistivity-switching metal oxide or nitride compound, the metal oxide or nitride compound including only one metal. The array, when some cells have been programmed, may comprise a) a first memory cell storing a first data state, wherein the antifuse of the first cell is unruptured and the resistance-switching memory element of the first cell is in a high-resistivity state; b) a second memory cell storing a second data state, wherein the antifuse of the second cell is ruptured and the resistivity-switching memory element of the second cell is in a low-resistivity state; and c) a third memory cell storing a third data state, wherein the antifuse of the third memory cell is ruptured and the resistivity-switching memory element of the third cell is in a high-resistivity state. Such a memory array may further comprise d) a fourth memory cell storing a fourth data state, wherein the antifuse of the fourth memory cell is not ruptured and the resistivity-switching memory element of the third cell is in a low-resistivity state.

The nonvolatile memory array further comprises circuitry to program the memory cells of this array, wherein the circuitry is adapted to program each memory cell of the first plurality to a programmed value one time. As will be described, the array may be formed as a monolithic three dimensional memory array comprising a first memory level monolithically formed above a semiconductor substrate, and a second memory level monolithically formed above the first memory level.

Fabrication Options

A monolithic three dimensional memory array formed according to embodiments of the present invention may be formed in many ways, with many variations. Some of the more important variations will be discussed first, and then a detailed example will be given.

Silicided or non-silicided diode: As is more fully described in Herner, U.S. patent application Ser. No. 10/954,510, "Memory Cell Comprising a Semiconductor Junction Diode Crystallized Adjacent to a Silicide," filed Sep. 29, 2004; and in Herner et al., U.S. patent application Ser. No. 11/148,530, "Nonvolatile Memory Cell Operating by Increasing Order in Polycrystalline Semiconductor Material," filed Jun. 8, 2005 and hereinafter the '530 application, both hereby incorporated by reference, when polycrystalline silicon, or polysilicon, is crystallized adjacent to certain silicides, such as cobalt silicide and titanium silicide formed in appropriate orientation, the crystal lattice of the silicide may provide an advantageous crystallization template as the polysilicon of the diode crystallizes. When crystallizing adjacent to a silicide with a good lattice match, the polysilicon tends to crystallize with fewer defects than if the polysilicon is crystallized adjacent to a material with which it has a greater lattice mismatch, such as titanium nitride.

As described in the '530 application, a high-defect polysilicon diode crystallized adjacent to a material with which it has a poor lattice match, such as titanium nitride, will be formed of relatively high-resistivity polysilicon, and will permit very low current flow under an applied forward read voltage. Application of a larger programming voltage, however, apparently increases the degree of crystalline order of the polysilicon, reducing its resistivity. No significant dopant diffusion appears to occur, as the diode exhibits good rectifying behavior. After programming, the current flow through the diode at the same applied read voltage is much higher. This before-and-after current difference provides the basis for a one-time-programmable memory cell.

In preferred embodiments of the present invention, if the diode is formed of silicon or a silicon-rich alloy, the diode is crystallized adjacent to a silicide such as titanium silicide or cobalt silicide, such that the diode is formed of lower-resistivity material in its initial state, without a programming pulse. When the state of the antifuse is used to store data, careful control is required to set the correct data state. This control is more easily achieved when the diode is formed of low-resistivity polysilicon. The silicide layer may be removed after the polysilicon of the diode has been crystallized, or it may remain in the finished device. The example to be described will include a silicide layer to provide a crystallization template for the diode material.

Added metal in resistivity-switching layer: Some of the named resistivity-switching metal oxides or nitrides require relatively high set and reset voltages and/or currents to switch resistivity states. Some of these materials, in some environments, are formed in a high-resistivity state and require a high-amplitude forming pulse to make the first conversion from high-resistivity to low-resistivity. Subsequent low-to-high and high-to-low-resistivity conversions then can be achieved using lower voltages.

As described in Herner et al., U.S. patent application Ser. No. 11/287,452, "Reversible Resistivity-Switching Metal Oxide or Nitride Layer with added Metal," filed Nov. 23, 2005, hereinafter the '452 application and hereby incorporated by reference, adding a metal to the resistivity-switching metal oxide or nitride compound has been effective in reducing the set and reset voltages required to switch a resistivity-switching layer of the metal oxide or nitride compound between stable resistivity states. Use of added metals may reduce the amplitude of the forming pulse or eliminate the need for it entirely.

A metal additive such as cobalt or aluminum is added such that the metal additive is between about 0.01 and about 5 percent of the metal atoms in the layer of metal oxide or nitride compound. Preferred metals include cobalt, aluminum, gallium, indium, nickel, niobium, zirconium, titanium, hafnium, tantalum, magnesium, chromium, vanadium, boron, yttrium, and lanthanum. The added metal may be different from the metal forming the metal oxide or nitride compound, or it may be the same.

Several methods may be used to incorporate the metal additive. For example, the metal can be added by ion implantation, or, if the metal is sufficiently mobile it may be deposited or otherwise provided adjacent to the resistivity-switching layer such that it will diffuse into the layer. Alternatively, the resistivity-switching metal oxide or nitride can be formed by sputtering from an alloyed sputtering target in an oxygen or nitrogen atmosphere, where the sputtering target includes both the metal forming the metal oxide or nitride compound and the added metal in an appropriate proportion, as described in the '452 application.

Resistivity-switching layer and antifuse location: In preferred embodiments, the resistivity-switching layer and dielectric rupture antifuse are formed electrically in series with a diode, these elements disposed between a top and a bottom conductor, as in FIG. 1. Many variations are possible. The resistivity-switching layer 118 may be above the diode 30, as in FIG. 1, or below. The resistivity-switching layer 118 may be part of a pillar 300, as in FIG. 1.

If the resistivity-switching material is formed in a relatively high-resistivity state, it may be formed as part of the top conductor or the bottom conductor. Resistivity switching will take place only in a narrow switching region where set and reset pulses are applied, and the higher resistivity of the non-switching region will prevent adjacent cells from being shorted together.

The antifuse can be, for example, either above or below the resistivity-switching layer. If the resistivity-switching layer and the diode are both formed in a vertically oriented pillar, as in FIG. 1, the resistivity-switching layer and the diode may be formed in a single patterning step, or in separate patterning steps. There will generally be associated additional layers, such as barrier and adhesion layers, as will be described.

The preferred material for the diode is silicon. In alternative embodiments, however, the diode may be germanium, silicon-germanium, or alloys of silicon or germanium.

Any of the fabrication options just described may be combined.

A detailed example of fabrication methods will be given describing an advantageous method of forming a preferred memory cell according to an embodiment of the present invention in which the state of the antifuse serves to store data. This example is provided for clarity and completeness, but is not intended to be limiting, and it will be understood by those skilled in the art that structures and devices falling within the scope of the invention may be formed using many other methods An advantageous method for making a dense nonvolatile one-time programmable memory array which is readily manufacturable is taught in Herner et al., U.S. patent application Ser. No. 10/326,470, since abandoned, and hereby incorporated by reference. Related memory arrays, and their use and methods of manufacture, are taught in Herner et al., U.S. patent application Ser. No. 10/955,549, "Nonvolatile Memory Cell Without a Dielectric Antifuse Having High- and Low-Impedance States," filed Sep. 29, 2004; and in Herner et al., U.S. patent application Ser. No. 11/015,824, "Nonvolatile Memory Cell Comprising a Reduced Height Vertical Diode," filed Dec. 17, 2004, all hereby incorporated by reference. Methods taught in these incorporated applications will be useful in fabricating a memory array according to the present invention. To avoid obscuring the invention, many details from the incorporated patents and applications will be omitted. It will be understood, however, that no teaching from these patents and applications is intended to be excluded.

Fabrication

Example

A detailed example will be provided of fabrication of a monolithic three dimensional memory array formed according to a preferred embodiment of the present invention. For clarity many details, including steps, materials, and process conditions, will be included. It will be understood that this example is non-limiting, and that these details can be modified, omitted, or augmented while the results fall within the scope of the invention.

Figure 3A:
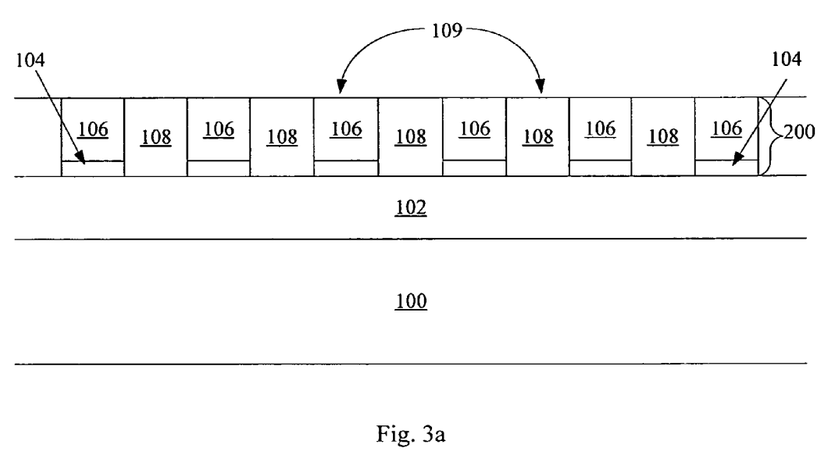
FIGS. 3a-3d are cross-sectional views illustrating stages in formation of a memory level in a monolithic three dimensional memory array formed according to a preferred embodiment of the present invention.

Turning to FIG. 3a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106. A preferred material for the adhesion layer 104 is titanium nitride, though other materials may be used, or this layer may be omitted. Adhesion layer 104 can be deposited by any conventional method, for example by sputtering.

The thickness of adhesion layer 104 can range from about 20 to about 500 angstroms, and is preferably between about 100 and about 400 angstroms, most preferably about 200 angstroms. Note that in this discussion, "thickness" will denote vertical thickness, measured in a direction perpendicular to substrate 100.

The next layer to be deposited is conducting layer 106. Conducting layer 106 can comprise any conducting material known in the art, such as doped semiconductor, metals such as tungsten, or conductive metal silicides; in a preferred embodiment, conducting layer 106 is tungsten.

Once all the layers that will form the conductor rails have been deposited, the layers will be patterned and etched using any suitable masking and etching process to form substantially parallel, substantially coplanar conductors 200, shown in FIG. 12a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 12a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpatterned Etchback to Expose Buried Patterned Features," filed Jun. 30, 2004 and hereby incorporated by reference in its entirety, can advantageously be used.

Alternatively, conductor rails can be formed by a damascene process, in which oxide is deposited, trenches are etched in the oxide, then the trenches are filled with conductive material to create the conductor rails.

Figure 3B:
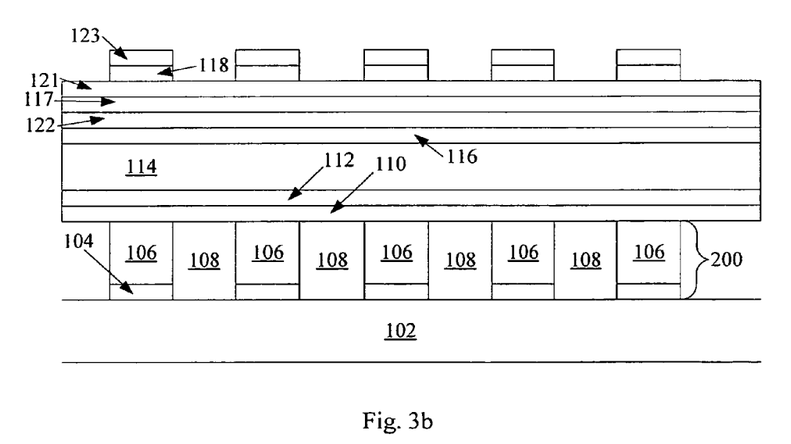

Next, turning to FIG. 3b, pillars including vertical diodes will be formed above completed conductor rails 200. (To save space substrate 100 is omitted in FIG. 3b and subsequent figures; its presence will be assumed.) In preferred embodiments a barrier layer 110, preferably of titanium nitride, is deposited on planar surface 109 to prevent formation of tungsten silicide, which may damage the diode about to be formed.

Semiconductor material that will be patterned into pillars is deposited. The semiconductor material can be, for example, silicon, germanium, or alloys of silicon and/or germanium. The present example will describe the use of silicon, though it will be understood that other materials may be used instead.

In preferred embodiments, the semiconductor pillar comprises a junction diode, the junction diode comprising a bottom heavily doped region of a first conductivity type and a top heavily doped region of a second conductivity type. The middle region, between the top and bottom regions, is an intrinsic or lightly doped region of either the first or second conductivity type. A semiconductor junction diode is a semiconductor device with the property of conducting current more easily in one direction than the other, having two terminal electrodes, and made of semiconducting material which is p-type at one electrode and n-type at the other.

In this example, bottom heavily doped region 112 is heavily doped n-type silicon. In a most preferred embodiment, heavily doped region 112 is deposited and doped with an n-type dopant such as phosphorus by any conventional method, preferably by in situ doping. This layer is preferably between about 200 and about 800 angstroms.

Next the silicon that will form the remainder of the diode is deposited. In some embodiments a subsequent planarization step will remove some silicon, so an extra thickness is deposited. If the planarization step is performed using a conventional CMP method, about 800 angstroms of thickness may be lost (this is an average; the amount varies across the wafer. Depending on the slurry and methods used during CMP, the silicon loss may be more or less.) If the planarization step is performed by an etchback method, only about 400 angstroms of silicon or less may be removed. Depending on the planarization method to be used and the desired final thickness, between about 800 and about 4000 angstroms of undoped silicon is deposited by any conventional method; preferably between about 1500 and about 2500 angstroms; most preferably between about 1800 and about 2200 angstroms. If desired, the silicon can be lightly doped. Finally top heavily doped region 116 is formed by ion implantation of a p-type dopant such as boron or $BF_2$.

A thin layer of a metal which will form a silicide having a close lattice match with silicon is deposited on heavily doped n-type region 116. A preferred metal is titanium, preferably followed by a thin layer of titanium nitride. An anneal step causes the titanium to react with the underlying silicon, forming titanium silicide layer 122. The titanium nitride and any unreacted titanium are removed by a selective wet etch, leaving the silicide.

A thermal oxidation step, such as a rapid thermal anneal performed at about 800 degrees C. for about two minutes, forms oxide antifuse 117 on titanium silicide layer 122. This oxide may include both titanium and silicon, or just one of these. In other embodiments, antifuse 117 can comprise a deposited dielectric layer instead, such as silicon oxide or silicon oxynitride, or other high-K dielectrics, such as $Si_3N_4$, $Al_2O_5$, $HfO_2$, $TiO_2$, $HfSiO_2$, or $Ta_2O_5$. In general, oxides, nitrides, and oxynitrides which are grown rather than deposited (where these materials are considered to be grown if the layer is formed by consuming some portion of the underlying material, in this case titanium silicide layer 122) are denser and higher quality, with lower defects; thus grown dielectrics may be preferred as the dielectric rupture antifuse.

Optional barrier layer 121, preferably of titanium nitride, is deposited. Layer 121 may be between about 100 and about 400 angstroms, preferably about 200 angstroms. A layer 118 of a metal oxide or nitride resistivity-switching material is deposited on barrier layer 121, or if barrier layer 121 was omitted, this layer is deposited directly on antifuse 117. Resistivity-switching layer 118 is preferably between about 200 and about 400 angstroms thick. Resistivity-switching layer 118 is preferably formed of a metal oxide or nitride having including exactly one metal which exhibits resistance switching behavior; preferably a material selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, and $Al_xN_y$, where x and y range between 0 and 1. Examples are the stoichiometric compounds NiO, $Nb_2O_5$, $TiO_2$, $HfO_2$, $Al_2O_3$, $MgO_x$, CoO, $CrO_2$, VO, ZnO, ZrO, BN, and AlN, but nonstoichiometric compounds may be used as well. For simplicity this discussion will describe the use of nickel oxide in layer 118. It will be understood, however, that any of the other materials described can be used. Nickel oxide layer 118 preferably includes an added metal, as described in the '452 application. The metal additive is preferably between about 0.01 and about 5 percent of the metal atoms in the layer of metal oxide or nitride compound, and most preferred metal additives are cobalt or aluminum.

Finally in preferred embodiments barrier layer 123 is deposited on nickel oxide layer 118. Layer 123 is preferably titanium nitride, though some other appropriate conductive barrier material may be used instead. An upcoming planarization step will be performed on barrier layer 123 which may remove some of its thickness. To compensate, extra thickness may be deposited. For example, if a thickness of 200 angstroms is desired for layer 123, a thicker layer, such as 600 angstroms, may be deposited. In other embodiments either or both of barrier layers 121 and 123 may be omitted, or may be replaced with noble metals such as silver, gold, palladium, or platinum. Additional barrier and/or adhesion layers may be included.

Layers 123, 118, 121, 117, 122, 116, 114, 112, and 110 are patterned and etched into pillars 300 in a multi-step etch. First barrier layer 123 and NiO layer 118 are etched. Resistivity-switching NiO layer 118 can be sputter etched, or can be plasma etched using the method described in Raghuram et al., U.S. patent application Ser. No. 11/179,423, "Method of Plasma Etching Transition Metals and Their Compounds," filed Jul. 11, 2005, and hereby incorporated by reference. FIG. 3b shows the structure after the etch of NiO layer 118 is complete.

Etched layers 123 and 118 can then serve as a hard mask during etch of the remaining layers: barrier layer 121, antifuse 117, titanium silicide layer 122, heavily doped p-type region 116, intrinsic region 114, heavily doped region 112, and barrier layer 110, completing formation of pillars 300. Pillars 300 should have about the same pitch and about the same width as conductors 200 below, such that each pillar 300 is formed on top of a conductor 200. Some misalignment can be tolerated.

The photolithography techniques described in Chen, U.S. patent application Ser. No. 10/728,436, "Photomask Features with Interior Nonprinting Window Using Alternating Phase Shifting," filed Dec. 5, 2003; or Chen, U.S. patent application Ser. No. 10/815,312, "Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Figure 3C:
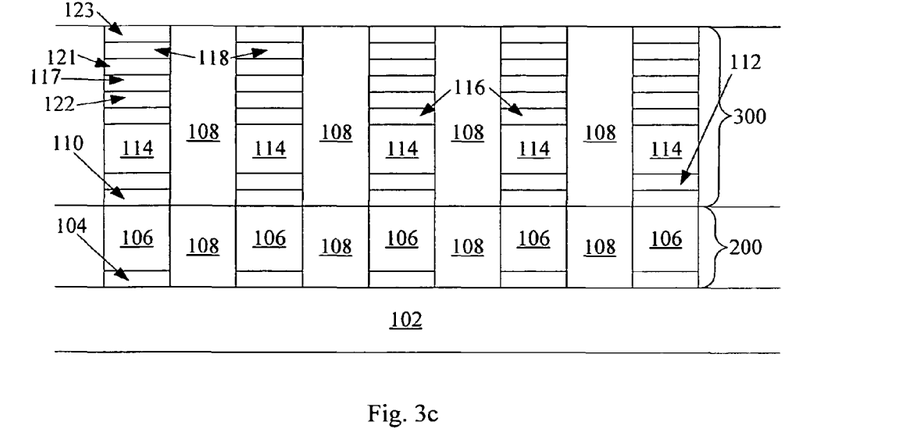

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used. The resulting structure is shown in FIG. 3c.

In alternative embodiments, barrier layer 121, NiO layer 118, and barrier layer 123 can be formed before (and therefore beneath) diode layers 112, 114, and 116, and may be patterned in the same or in a separate patterning step. Antifuse layer 117 can be above or below the diode, or below barrier layer 121 or above barrier layer 123.

To summarize, the diode was formed by a method comprising: depositing a semiconductor layerstack of silicon, germanium, or an alloy of silicon or germanium; and patterning and etching the layerstack to form a vertically oriented pillar. The semiconductor layerstack is crystallized to form a polycrystalline diode, and is preferably crystallized adjacent to a silicide.

Figure 3D:
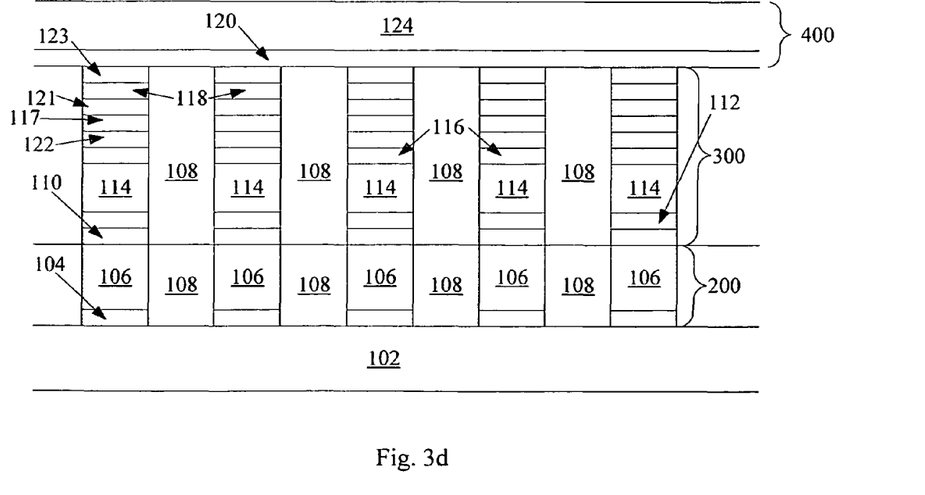

Turning to FIG. 3d, next a conductive material or stack is deposited to form the top conductors 400. In a preferred embodiment, titanium nitride barrier layer 120 is deposited next, followed by tungsten layer 124. Top conductors 400 can be patterned and etched in the same manner as bottom conductors 200. Overlying second conductors 400 will preferably extend in a different direction from first conductors 200, preferably substantially perpendicular to them. Each pillar 300 should be formed at the intersection of a top conductor 400 and a bottom conductor 200. Some misalignment may be tolerated. A dielectric material (not shown) is deposited over and between conductors 400. The resulting structure, shown in FIG. 3d, is a bottom or first story of memory cells.

Additional memory levels can be formed above this first memory level. In some embodiments, conductors can be shared between memory levels; i.e. top conductor 400 would serve as the bottom conductor of the next memory level. In this case a CMP step would remove dielectric overfill, exposing top conductors 400 at a substantially planar surface. In other embodiments, an interlevel dielectric is formed above the first memory level of FIG. 3c, its surface planarized without exposing conductors 400, and construction of a second memory level begins on this planarized interlevel dielectric, with no shared conductors.

An anneal step crystallizes silicon regions 112, 114, and 116 of the diodes to polysilicon. This anneal may be done as a single step after fabrication of the memory levels is complete, or the temperature required to grow the antifuse by thermal oxidation may be sufficient to crystallize the semiconductor material of each memory level as it is formed, and a separate anneal may not be required.

In the example provided, nickel oxide layer 118 and its associated barrier layers were patterned in a single patterning step with the diode regions 112, 114, and 116 underneath, the nickel oxide serving as a hard mask during the diode etch. It may be preferred to pattern and etch the diode layers first, fill gaps between them with dielectric, and planarize to expose the tops of the diodes, then to deposit nickel oxide layer 118 together with its barrier layers 121 and 123, then to pattern and etch these layers in a separate patterning step.

What has been described is monolithic three dimensional memory array comprising: i) a first memory level monolithically formed above a substrate, the first memory level comprising: a) a plurality of substantially parallel, substantially coplanar first conductors; b) a plurality of substantially parallel, substantially coplanar second conductors above the first conductors; and c) a first plurality of memory cells, each memory cell comprising a dielectric rupture antifuse, a portion of one of the bottom conductors, and a portion of one of the top conductors, a layer of a resistivity-switching metal oxide or nitride compound, wherein the metal oxide or nitride compound includes only one metal, and wherein the dielectric rupture antifuse and the layer of resistivity-switching metal oxide or nitride are arranged electrically in series between the portion of the top conductor and the portion of the bottom conductor, wherein each memory cell of the first plurality is a one-time programmable memory cell, and ii) a second memory level monolithically formed above the first memory level.

Each memory cell of the first plurality further comprises a diode arranged electrically in series with the dielectric rupture antifuse and the layer of resistivity-switching metal oxide or nitride compound between the portion of the bottom conductor and the portion of the top conductor. Each memory cell is capable of storing one of three or four possible data states.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory array comprising a first plurality of memory cells, each memory cell of the first plurality comprising:
   a dielectric rupture antifuse;
   a resistance-switching memory element comprising a layer of a resistivity-switching metal oxide compound, the compound including only one metal, and a metal additive disposed in the compound, wherein the metal additive is selected from the group consisting of cobalt, aluminum, gallium, indium, and boron, and comprises about 0.01 and about 5 percent of the metal atoms in the layer of the compound;
   wherein the array comprises:
   a) a first memory cell storing a first data state, wherein the antifuse of the first cell is unruptured and the resistance-switching memory element of the first cell is in a high-resistivity state;
   b) a second memory cell storing a second data state, wherein the antifuse of the second cell is ruptured and the resistivity-switching memory element of the second cell is in a low-resistivity state; and c) a third memory cell storing a third data state, wherein the antifuse of the third memory cell is ruptured and the resistivity-switching memory element of the third cell is in a high-resistivity state.

2. The nonvolatile memory array of claim 1, further comprising circuitry to program the cells of the first plurality, wherein the circuitry is adapted to program each memory cell of the first plurality to a programmed value one time.

3. The nonvolatile memory array of claim 1, wherein the metal oxide is selected from the group consisting of $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, and $Zr_xO_y$.

4. The nonvolatile memory array of claim 1 wherein each cell of the first plurality of memory cells further comprises a diode arranged electrically in series with the resistance-switching element and the dielectric rupture antifuse.

5. The nonvolatile memory array of claim 4 wherein the diode is a semiconductor junction diode comprising silicon, germanium, or an alloy of silicon or germanium.

6. The nonvolatile memory array of claim 1 wherein the array is a monolithic three dimensional memory array comprising a first memory level monolithically formed above a semiconductor substrate, and a second memory level monolithically formed above the first memory level.

7. The nonvolatile memory array of claim 1, further comprising d) a fourth memory cell storing a fourth data state, wherein the antifuse of the fourth memory cell is not ruptured and the resistivity-switching memory element of the fourth cell is in a low-resistivity state.

* * * * *